US011174402B2

(12) United States Patent
Meura

(10) Patent No.: US 11,174,402 B2
(45) Date of Patent: Nov. 16, 2021

(54) THERMOSETTING RESIN COMPOSITION FOR LDS, RESIN MOLDED ARTICLE, AND THREE-DIMENSIONAL MOLDED INTERCONNECT DEVICE

(71) Applicant: SUMITOMO BAKELITE CO., LTD., Tokyo (JP)

(72) Inventor: Toru Meura, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 16/302,299

(22) PCT Filed: Apr. 10, 2017

(86) PCT No.: PCT/JP2017/014663
§ 371 (c)(1),
(2) Date: Nov. 16, 2018

(87) PCT Pub. No.: WO2017/199639
PCT Pub. Date: Nov. 23, 2017

(65) Prior Publication Data
US 2019/0292386 A1    Sep. 26, 2019

(30) Foreign Application Priority Data

May 18, 2016 (JP) .............................. JP2016-099412

(51) Int. Cl.
| C09D 11/101 | (2014.01) |
| B33Y 70/00  | (2020.01) |
| B33Y 80/00  | (2015.01) |
| C09D 11/037 | (2014.01) |
| C09D 11/102 | (2014.01) |
| H05K 1/03   | (2006.01) |
| H05K 3/18   | (2006.01) |
| C08L 63/00  | (2006.01) |
| C08K 5/54   | (2006.01) |
| C08K 3/36   | (2006.01) |
| C23C 18/16  | (2006.01) |
| C08K 3/22   | (2006.01) |
| H05K 3/10   | (2006.01) |
| C08L 101/12 | (2006.01) |

(52) U.S. Cl.
CPC ............ *C09D 11/101* (2013.01); *B33Y 70/00* (2014.12); *B33Y 80/00* (2014.12); *C08K 3/22* (2013.01); *C08K 3/36* (2013.01); *C08K 5/54* (2013.01); *C08L 63/00* (2013.01); *C08L 101/12* (2013.01); *C09D 11/037* (2013.01); *C09D 11/102* (2013.01); *C23C 18/16* (2013.01); *H05K 1/03* (2013.01); *H05K 1/0373* (2013.01); *H05K 3/10* (2013.01); *H05K 3/182* (2013.01); *H05K 2201/0209* (2013.01); *H05K 2201/0236* (2013.01); *H05K 2201/0239* (2013.01); *H05K 2203/107* (2013.01)

(58) Field of Classification Search
None
See application file for complete search history.

(56) References Cited

U.S. PATENT DOCUMENTS

| 8,585,272 | B2 | 11/2013 | Kotani et al. |
| 9,499,910 | B2 | 11/2016 | Yee et al. |
| 9,676,927 | B2 | 6/2017 | Musick et al. |
| 9,688,835 | B2 | 6/2017 | Schrauwen |
| 9,783,890 | B2 | 10/2017 | Yee et al. |
| 9,982,113 | B2 | 5/2018 | Kniess et al. |
| 2011/0039978 | A1 | 2/2011 | Kotani et al. |
| 2012/0276390 | A1 | 11/2012 | Ji et al. |
| 2014/0120263 | A1 | 5/2014 | Yee et al. |
| 2014/0353543 | A1* | 12/2014 | Wu .......................... C09K 5/14 252/75 |
| 2015/0035720 | A1 | 2/2015 | Schrauwen |
| 2015/0257277 | A1* | 9/2015 | Shirahase ............... H05K 1/036 174/250 |
| 2015/0291778 | A1 | 10/2015 | Musick et al. |
| 2015/0322574 | A1 | 11/2015 | Yee et al. |

(Continued)

FOREIGN PATENT DOCUMENTS

| CN | 105504686 A | 4/2016 |
| JP | 2013-545832 A | 12/2013 |
| JP | 2014-88618 A | 5/2014 |

(Continued)

OTHER PUBLICATIONS

Technical Data Sheet "BLACK 30C965" and "BLACK 1G". Dynamix, The Shepard Color Company. Jan. 28, 2015 (Year: 2015).*
Office Action dated Mar. 12, 2019, in Korean Patent Application No. 10-2018-7034762.
Office Action dated Jun. 14, 2019 in Chinese Patent Application No. 201780030491.6.

(Continued)

*Primary Examiner* — Megan McCulley
(74) *Attorney, Agent, or Firm* — Birch, Stewart, Kolasch & Birch, LLP

(57) ABSTRACT

The thermosetting resin composition for LDS of the invention includes a thermosetting resin, an inorganic filler, a non-conductive metal compound that forms a metal nucleus upon irradiation with active energy rays, and a coupling agent, in which the non-conductive metal compound includes one or more selected from the group consisting of a spinel-type metal oxide, a metal oxide having two or more transition metal elements in groups adjacent to each other, the groups being selected from groups 3 to 12 of the periodic table, and a tin-containing oxide, and the coupling agent includes one or more selected from the group consisting of mercaptosilane, aminosilane, and epoxysilane.

18 Claims, No Drawings

(56) References Cited

U.S. PATENT DOCUMENTS

2017/0137611 A1    5/2017   Kniess et al.
2017/0208685 A1    7/2017   Schrauwen

FOREIGN PATENT DOCUMENTS

| JP | 2015-108123 A | 6/2015 |
|---|---|---|
| JP | 2015-134903 A | 7/2015 |
| JP | 2015-520775 A | 7/2015 |
| JP | 2017-513794 A | 6/2017 |
| KR | 10-2015-0140868 A | 12/2015 |
| WO | WO 2015/157354 A1 | 10/2015 |
| WO | WO 2015/197157 A1 | 12/2015 |

OTHER PUBLICATIONS

International Search Report (PCT/ISA/210) issued in PCT/JP2017/014663, dated Jun. 20, 2017.
Japan Office Action for application No. 2017-536364 dated Aug. 29, 2017.
Office Action dated May 8, 2020, in Chinese Patent Application No. 201780030491.6.
Wenjin, X. and B. Jianquan, "Introduction of Molded Interconnect Devices (MID)," The 15th Annual Conference of Information Theory of China Electronics Association and the First Annual Conference of National Network Coding (vol. 2), published Jul. 1, 2008, pp. 1121-1122 (with abstract).

* cited by examiner

THERMOSETTING RESIN COMPOSITION FOR LDS, RESIN MOLDED ARTICLE, AND THREE-DIMENSIONAL MOLDED INTERCONNECT DEVICE

TECHNICAL FIELD

The present invention relates to a thermosetting resin composition for LDS, a resin molded article, and a three-dimensional molded interconnect device.

BACKGROUND ART

Examples of a resin material for use in laser direct structuring (LDS) include a fiber-reinforced resin material formed by impregnating a thermoplastic resin composition including LDS additive in fiber. As such a kind of technique, there is a technique described in Patent Document 1 may be mentioned. According to this document, a polyamide resin is used as a thermoplastic resin.

RELATED DOCUMENT

Patent Document

[Patent Document 1] Japanese Laid-Open Patent Publication No. 2015-134903

SUMMARY OF THE INVENTION

However, as a result of investigations conducted by the present inventors, it was proven that thermoplastic resins have hitherto been investigated as a kind of resin containing LDS additive, whereas thermosetting resins have not still been sufficiently investigated. Therefore, it could be seen that a thermosetting resin composition for LDS, using a thermosetting resin, still have a room for improvement of plating deposit characteristics.

According to the invention, provided is a thermosetting resin composition for laser direct structuring (LDS), used for formation of LDS, including:

a thermosetting resin,
an inorganic filler,
a non-conductive metal compound that forms a metal nucleus upon irradiation with active energy rays, and
a coupling agent,
in which the non-conductive metal compound includes one or more selected from the group consisting of:
a spinel-type metal oxide,
a metal oxide having two or more transition metal elements in groups adjacent to each other, the groups being selected from groups 3 to 12 of the periodic table, and
a tin-containing oxide, and
the coupling agent includes one or more selected from the group consisting of mercaptosilane, aminosilane, and epoxysilane.

Furthermore, a resin molded article including a cured product of the thermosetting resin composition for LDS is also provided.

In addition, a three-dimensional molded interconnect device including:

the resin molded article having a three-dimensional structure, and
a three-dimensional circuit formed on a surface of the resin molded article
is also provided.

According to the invention, a thermosetting resin composition for LDS, having excellent plating deposit characteristics, and a resin molded article and a three-dimensional molded interconnect device, each using the composition, are provided.

DESCRIPTION OF EMBODIMENTS

Hereinafter, the thermosetting resin composition of an embodiment of the invention will be described.

The thermosetting resin composition of the present embodiment is a thermosetting resin composition for LDS, which is used for LDS. The laser direct structuring (LDS) is one of methods for producing a three-dimensional molded interconnect device (MID), in which a metal nucleus is produced on a surface of a resin molded article containing a LDS additive upon irradiation with active energy rays, and the metal nucleus as a seed can be subjected to an electroless plating treatment or the like, thereby forming a plated pattern (wiring) in a region irradiated with energy rays.

The thermosetting resin composition of the present embodiment can include a thermosetting resin, an inorganic filler, a non-conductive metal compound that forms a metal nucleus upon irradiation with active energy rays, and a coupling agent.

In the present embodiment, the non-conductive metal compound acts as the LDS additive, and can include one or more selected from the group consisting of (i) a spinel-type metal oxide, (ii) a metal oxide having two or more transition metal elements in groups adjacent to each other, the groups being selected from groups 3 to 12 of the periodic table, and (iii) a tin-containing oxide. Further, the coupling agent can include one or more selected from the group consisting of mercaptosilane, aminosilane, and epoxysilane.

In the present embodiment, the non-conductive metal compound is not particularly limited as long as it can form a metal nucleus upon irradiation with active energy rays. Detailed mechanism thereof is not clear, but it is considered that such the non-conductive metal compound allows the metal nucleus to be activated (for example, reduced), and thus, a metal nucleus capable of being plated with a metal upon irradiation with active energy rays such as YAG laser having an absorbable wavelength region is produced. Incidentally, in a case where a surface of a cured product of a thermosetting resin composition having the non-conductive metal compound dispersed therein is irradiated with the active energy rays, a seed region having a metal nucleus capable of being plated with a metal is formed on the irradiated surface. By using the obtained seed region, it is possible to form a plated pattern such as a circuit on a surface of the cured product of the thermosetting resin composition.

According to the present embodiment, it is possible to improve the plating deposit characteristics in a cured product of the thermosetting resin composition by selecting an appropriate coupling agent in the thermosetting resin composition.

Hereinafter, the respective components of the thermosetting resin composition of the present embodiment will be described.

The thermosetting resin composition of the present embodiment contains a thermosetting resin.

As the thermosetting resin, for example, one or two or more selected from the group consisting of an epoxy resin, a phenol resin, an oxetane resin, a (meth)acrylate resin, an unsaturated polyester resin, a diallyl phthalate resin, and a maleimide resin can be included. Among these, the epoxy resin is particularly preferably included from the viewpoint of improving curability, preservability, heat resistance, moisture resistance, and chemical resistance.

In the present embodiment, as an epoxy resin included in the thermosetting resin, an entirety of monomers, oligomers, or polymers having two or more epoxy groups within one molecule can be used, and their molecular weights or molecule structures are not particularly limited. In the present embodiment, the epoxy resin can include, for example, one or two or more selected from the group consisting of biphenyl-type epoxy resins; bisphenol-type epoxy resins such as a bisphenol A-type epoxy resin, a bisphenol F-type epoxy resin, and a tetramethylbisphenol F-type epoxy resin; stilbene-type epoxy resins; novolac-type epoxy resins such as a phenol novolac-type epoxy resin and a cresol novolac-type epoxy resin; polyfunctional epoxy resins such as trisphenol-type epoxy resins exemplified as a triphenolmethane-type epoxy resin, an alkyl-modified triphenolmethane-type epoxy resin, or the like; phenolaralkyl-type epoxy resins such as a phenolaralkyl-type epoxy resin having a phenylene skeleton, a naphtholaralkyl-type epoxy resin having a phenylene skeleton, a phenolaralkyl-type epoxy resin having a biphenylene skeleton, and a naphtholaralkyl-type epoxy resin having a biphenylene skeleton; naphthol-type epoxy resins such as a dihydroxynaphthalene-type epoxy resin and an epoxy resin obtained by glycidyl-etherification of a dimer of dihydroxynaphthalene; triazine nucleus-containing epoxy resins such as triglycidyl isocyanurate and monoallyl diglycidyl isocyanurate; and bridged cyclic hydrocarbon compound-modified phenol-type epoxy resins such as a dicyclopentadiene-modified phenol-type epoxy resin. These may be used singly or in combination of two or more kinds thereof.

From the viewpoint of suppressing the warp of a molded product or improving a balance of all the characteristics such as fillability, heat resistance, and moisture resistance, among those, the novolac-type epoxy resins, the polyfunctional epoxy resins, or the phenolaralkyl-type epoxy resins can be used. Further, as the epoxy resin, one or more selected from the group consisting of an orthocresol novolac-type epoxy resin, a phenolaralkyl resin-type epoxy resin having a biphenylene skeleton, and a triphenylmethane-type epoxy resin can be included. By appropriately selecting such the epoxy resin and the coupling agent, the plating deposit characteristics in a cured product of the thermosetting resin composition can be improved.

In the present embodiment, a lower limit value of the content of the thermosetting resin is equal to or more than 1% by mass, more preferably equal to or more than 2% by mass, and particularly preferably equal to or more than 2.5% by mass, with respect to the total amount of the thermosetting resin composition. With these values, it is possible to improve the fluidity during molding. Thus, the improvement of fillability or molding stability can be accelerated. On the other hand, an upper limit value of the content of the thermosetting resin is, for example, preferably equal to or less than 15% by mass, more preferably equal to or less than 14% by mass, and particularly preferably equal to or less than 13% by mass, with respect to the total amount of the thermosetting resin composition. With these values, it is possible to improve the moisture resistance reliability or the reflow resistance. In addition, it is possible to make a contribution to suppression of the warp of a molded product by controlling the content of the thermosetting resin such ranges.

In the present embodiment, the content with respect to the total amount of the thermosetting resin composition refers to a content with respect to the total solid content resulting from the removal of a solvent in the thermosetting resin composition in a case of including the solvent. The solid content of the thermosetting resin composition refers to non-volatile components in the thermosetting resin composition, and refers to a residue resulting from the removal of volatile components such as water and solvents.

The thermosetting resin composition of the present embodiment can contain a curing agent.

The curing agent can be broadly divided into three types such as, for example, a polyaddition-type curing agent, a catalyst-type curing agent, and a condensation-type curing agent. These may be used singly or in combination of two or more kinds thereof.

Examples of the polyaddition-type curing agent used as the curing agent include one or two or more selected from the group consisting of polyamine compounds including dicyandiamide (DICY), organic acid dihydrazide, and the like as well as aliphatic polyamines such as diethylenetriamine (DETA), triethylenetetramine (TETA), and metaxylylenediamine (MXDA), aromatic polyamines such as diaminodiphenylmethane (DDM), m-phenylenediamine (MPDA), and diaminodiphenylsulfone (DDS); acid anhydrides including alicyclic acid anhydrides such as hexahydrophthalic anhydride (HHPA) and methyltetrahydrophthalic anhydride (MTHPA), aromatic acid anhydrides such as trimellitic anhydride (TMA), pyromellitic anhydride (PMDA), and benzophenonetetracarboxylic acid anhydride (BTDA), and the like; phenol resin-based curing agents such as a novolac-type phenol resin, a polyvinylphenol, and an aralkyl-type phenol resin; polymercaptan compounds such as a polysulfide, a thioester, and a thioether; isocyanate compounds such as an isocyanate prepolymer and a blocked isocyanate; and organic acids such as a carboxylic acid-containing polyester resin.

Examples of the catalyst-type curing agent used as the curing agent include one or two or more selected from the group consisting of tertiary amine compounds such as benzyldimethylamine (BDMA) and 2,4,6-trisdimethylaminomethylphenol (DMP-30); imidazole compounds such as 2-methylimidazole and 2-ethyl-4-methylimidazole (EMI24); and Lewis acids such as BF3 complexes.

Examples of the condensation-type curing agent used as the curing agent include one or two or more selected from the group consisting of a resol-type phenol resin; urea resins such as a methylol group-containing urea resin; and melamine resins such as a methylol group-containing melamine resin.

Among these, from the viewpoint of improving a balance of flame resistance, moisture resistance, electrical characteristics, curability, storage stability, and the like, the phenol resin-based curing agents are more preferably included. As the phenol resin-based curing agents, all of monomers, oligomers, and polymers, each having two or more phenolic hydroxyl groups in one molecule, can be used, and molecular weights and molecular structures thereof are not particularly limited.

Examples of the phenol resin-based curing agents used as the curing agent of the present embodiment include one or two or more selected from the group consisting of novolac-type resins such as a phenol-novolac resin, a cresol-novolac resin, and bisphenol novolac; polyfunctional phenol resins such as a polyvinyl phenol and a triphenolmethane phenol resin; modified phenol resins such as a terpene-modified phenol resin and a dicyclopentadiene-modified phenol resin; phenol aralkyl-type phenol resins such as a phenol aralkyl resin having a phenylene skeleton and/or a biphenylene skeleton, and a naphthol aralkyl resin having a phenylene and/or a biphenylene skeleton; and bisphenol compounds such as bisphenol A and bisphenol F. Among these, from the viewpoint of suppressing the warp of a molded product, a novolac-type phenol resin, a polyfunctional phenol resin, and a phenol aralkyl-type phenol resin are more preferably included. Further, a phenol novolac resin, a phenol aralkyl resin having a biphenylene skeleton, or a triphenylmethane-type phenol resin modified with formaldehyde can be preferably used.

In the present embodiment, a lower limit value of the content of the curing agent is, for example, preferably equal to or more than 0.5% by mass, more preferably equal to or more than 1% by mass, and particularly preferably equal to or more than 1.5% by mass, with respect to the total amount of the thermosetting resin composition. With these values, it is possible to realize excellent fluidity and improve fillability or moldability during molding. On the other hand, an upper limit value of the content of the curing agent is, for example, preferably equal to or less than 9% by mass, more preferably equal to or less than 8% by mass, and particularly preferably equal to or less than 7% by mass, with respect to the total amount of the thermosetting resin composition. With these values, it is possible to improve the moisture resistance reliability and the reflow resistance of electronic components. Further, it is possible to make a contribution to suppression of the warp of a molded product obtained by controlling the content of the curing agent to such ranges.

The thermosetting resin composition of the present embodiment contains a non-conductive metal compound.

Specific examples of the non-conductive metal compound include one or more selected from the group consisting of a spinel-type metal oxide, a metal oxide having two or more transition metal elements in groups adjacent to each other, the groups being selected from groups 3 to 12 of the periodic table, and a tin-containing oxide.

As for the spinel-type metal oxide, for example, the spinel-type structure is one of representative crystal structure types that are double oxides and found in $AB_2O_4$-type compounds (A and B are metal elements). The spinel-type structure may be any one of a forward spinel structure (A and B are partially interchanged) and an inverse spinel structure ($B(AB)O_4$), but the forward spinel structure can be more preferably used. In this case, A in the forward spinel structure may be copper.

As a metal element constituting the spinel-type metal oxide, for example, copper or chromium can be used. That is, the non-conductive metal compound can contain a spinel-type metal oxide including copper or chromium. For example, from the viewpoint of adhesiveness to a copper-plated pattern, copper can be used as the metal atom.

Moreover, as the metal atom, in addition to copper or chromium, metal atoms such as antimony, tin, lead, indium, iron, cobalt, nickel, zinc, cadmium, silver, bismuth, trace arsenic, manganese, magnesium, and calcium may be contained in trace amounts. These metal atoms in trace amounts may exist in the form of an oxide. Further, the contents of those metal atoms in trace amounts can be each equal to or less than 0.001% by mass with respect to all the metal atoms in the metal oxides.

In the present embodiment, the spinel-type metal oxide is thermally highly stable, and can have durability in an acidic or alkaline aqueous metallization bath. The spinel-type metal oxide can be present in a non-irradiated region on a surface of a cured product of the thermosetting resin composition, for example, by appropriately controlling the dispersibility of the thermosetting resin composition. Examples of such the spinel-type metal oxide are described in, for example, Japanese Patent No. 3881338.

Furthermore, the metal oxide having the transition metal element is a metal oxide having two or more transition metal elements in groups adjacent to each other, the groups being selected from groups 3 to 12 of the periodic table. Here, the metal belonging to the transition metal element can be represented to contain metals belonging to a group n and metals in a group n+1 of the periodic table. As a metal oxide having the transition metal element, oxides of the metals may be used singly or in combination of two or more kinds thereof.

Examples of the metals belonging to a group n of the periodic table include a group 3 (scandium and yttrium), a group 4 (titanium, zirconium, and the like), a group 5 (vanadium, niobium, and the like), a group 6 (chromium, molybdenum, and the like), a group 7 (manganese and the like), a group 8 (iron, ruthenium, and the like), a group 9 (cobalt, rhodium, iridium, and the like), a group 10 (nickel, palladium, and platinum), a group 11 (copper, silver, gold, and the like), a group 12 (zinc, cadmium, and the like), and a group 13 (aluminum, gallium, indium, and the like).

Examples of the metals in a group n+1 of the periodic table include a group 4 (titanium, zirconium, and the like), a group 5 (vanadium, niobium, and the like), a group 6 (chromium, molybdenum, and the like), a group 7 (manganese and the like), a group 8 (iron, ruthenium, and the like), a group 9 (cobalt, rhodium, iridium, and the like), a group 10 (nickel, palladium, and platinum), a group 11 (copper, silver, gold, and the like), a group 12 (zinc, cadmium, and the like), and a group 13 (aluminum, gallium, indium, and the like).

Examples of a metal oxide having such the transition metal element include those described in Japanese Patent No. 3881338.

Furthermore, the tin-containing oxide is a metal oxide containing at least tin. As a metal atom constituting the tin-containing oxide, antimony may be used, in addition to tin. Such the tin-containing oxide may contain tin oxide or antimony oxide.

For example, tin accounts for equal to or more than 90% by mass of metal components included in the tin-containing oxide, and antimony may account for equal to or more than 5% by mass of the metal components. This tin-containing oxide may further contain lead and/or copper as the metal component. Specifically, in the metal components included in the tin-containing oxide, for example, tin can account for equal to or more than 90% by mass, antimony can account for 5% to 9% by mass, lead can account for a range of 0.01% to 0.1% by mass, and copper can account for a range of 0.001% to 0.01% by mass. Such the tin-containing oxide can contain, for example, tin oxide, antimony oxide, lead oxide, and/or copper oxide. Further, the tin-containing oxide may contain metal atoms in trace amounts, exemplified as the spinel-type metal oxide. In addition, the tin-containing oxide may also be used in combination with a metal oxide having the spinel-type metal oxide or the transition metal element.

A lower limit value of the content of the non-conductive metal compound is, for example, equal to or more than 3% by mass, preferably equal to or more than 5% by mass, and still more preferably equal to or more than 8% by mass, with respect to the total amount of the thermosetting resin composition. With these values, it is possible to enhance the plating deposit characteristics in a cured product of the thermosetting resin composition. Further, an upper limit value of the content of the non-conductive metal compound is, for example, equal to or less than 20% by mass, preferably equal to or less than 18% by mass, and more preferably equal to or less than 15% by mass, with respect to the total amount of the thermosetting resin composition. With these values, it is possible to suppress a decrease in insulating properties or suppress an increase in a dielectric loss tangent in a cured product of the thermosetting resin composition. In addition, in a case where the non-conductive metal compound is non-spherical, it is possible to enhance the fluidity of the thermosetting resin composition.

The thermosetting resin composition of the present embodiment may contain at least one kind of thermally stable organic metal chelate complex, in addition to the non-conductive metal compound.

The thermosetting resin composition of the present embodiment may contain an inorganic filler.

Examples of the inorganic filler include one or two or more inorganic fillers selected from the group consisting of silica including, for example, molten silica such as molten crushed silica and molten spherical silica, and crystalline silica, alumina, aluminum hydroxide, silicon nitride, and aluminum nitride. Among these, as the inorganic filler, silica such as molten crushed silica, molten spherical silica, and crystalline silica is preferably used, and molten spherical silica is more preferably used. By using the spherical inorganic filler, it is possible to improve the dispersibility of the thermosetting resin composition.

Furthermore, an upper limit value of the average particle diameter D50 of the inorganic filler is, for example, equal to or less than 30 μm, preferably equal to or less than 20 μm, and more preferably equal to or less than 10 μm. With these values, it is possible to improve the through-hole workability in a cured product of the thermosetting resin composition. Further, it is also possible to reduce the width of the obtained circuit pattern. On the other hand, a lower limit of the average particle diameter D50 of the inorganic filler is not particularly limited, but is, for example, equal to or more than 0.01 μm, preferably equal to or more than 0.05 μm, and more preferably equal to or more than 0.1 μm. With these values, it is possible to appropriately control the melt viscosity of the thermosetting resin composition, and thus, improve moldability such as injection molding and transfer molding.

Moreover, an upper limit value of the D90 of the inorganic filler is, for example, equal to or less than 80 μm, preferably equal to or less than 70 μm, and more preferably equal to or less than 60 μm. With these values, it is possible to improve the through-hole workability by laser having a small opening diameter in the cured product of the thermosetting resin composition. Further, the surface roughness of the cured product after the laser processing can be reduced, and therefore, the plating deposit characteristics can be improved. On the other hand, a lower limit value of the D90 of the inorganic filler is not particularly limited, but it may be, for example, equal to or more than 1 μm, equal to or more than 3 μm, equal to or more than 10 μm, or equal to or more than 20 μm. With these values, it is possible to enhance the fluidity of the thermosetting resin composition, and thus, improve the formability more effectively. In addition, it is also possible to increase the bonding properties.

An upper limit value of the particle size distribution width (D90/D50) of the inorganic filler is, for example, equal to or less than 10, preferably equal to or less than 9, and more preferably equal to or less than 8. With these values, it is possible to suppress an unbalance of the surface roughness of a cured product of the thermosetting resin composition, and thus, improve the plating deposit characteristics. In addition, the lower limit value of the particle size distribution width (D90/D50) of the inorganic filler may be, for example, equal to or more than 1.

In the present embodiment, the D50 or D90 of the inorganic filler can be measured, based on a particle size distribution of particles in terms of a volume, using a commercially available laser diffraction particle size distribution analyzer (for example, SALD-7000 manufactured by Shimadzu Corporation). Here, the obtained median diameter (D50) can be used as an average particle diameter.

The thermosetting resin composition of the present embodiment can contain a curing accelerator.

As the curing accelerator, any of curing accelerators which accelerate a crosslinking reaction between a thermosetting resin and a curing agent may be used, and curing accelerators that are used for general thermosetting resin compositions can be used.

In the present embodiment, examples of the curing accelerator include one or two or more selected from phosphorus atom-containing compounds such as an organic phosphine, a tetra-substituted phosphonium compound, a phosphobetaine compound, an adduct of a phosphine compound and a quinone compound, and an adduct of a phosphonium compound and a silane compound; and nitrogen atom-containing compounds such as amidines or tertiary amines such as 1,8-diazabicyclo [5.4.0]undecene-7, benzyldimethylamine, and 2-methylimidazole, and quaternary salts of the amidines or the amines. Among these, the phosphorus atom-containing compounds are preferably included from the viewpoint of improving the curability. In addition, from the viewpoint of improving a balance between moldability and curability, it is more preferable to include those having a potential, such as a tetra-substituted phosphonium compound, a phosphobetaine compound, an adduct of a phosphine compound and a quinone compound, and an adduct of a phosphonium compound and a silane compound.

Examples of the organic phosphine that can be used in the thermosetting resin composition of the present embodiment include primary phosphines such as ethylphosphine and phenylphosphine; secondary phosphines such as dimethylphosphine and diphenylphosphine; and tertiary phosphines such as trimethylphosphine, triethylphosphine, tributylphosphine, and triphenylphosphine.

Examples of the tetra-substituted phosphonium compound that can be used in the thermosetting resin composition of the present embodiment include a compound represented by General Formula (6).

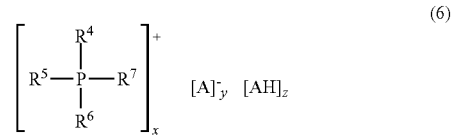

(In General Formula (6), P represents a phosphorus atom. $R^4$, $R^5$, $R^6$, and $R^7$ each represent an aromatic group. A represents an anion of an aromatic organic acid having at least one functional group selected from a hydroxyl group, a carboxyl group, and a thiol group in an aromatic ring. AH represents an aromatic organic acid having at least one functional group selected from a hydroxyl group, a carboxyl group, and a thiol group in an aromatic ring. x and y are each a number of 1 to 3, and z is a number of 0 to 3, with x=y.)

The compound represented by General Formula (6) can be obtained, for example, as follows, but the method is not limited thereto. First, a tetra-substituted phosphonium halide, an aromatic organic acid, and a base are added to an organic solvent and uniformly mixed to produce an aromatic organic acid anion in the solution system. Subsequently, water is added to the solution, and thus, the compound represented by General Formula (6) can be precipitated. In the compound represented by General Formula (6), $R^4$, $R^5$, $R^6$, and $R^7$, all of which are bonded to a phosphorus atom, are each preferably a phenyl group, AH is preferably a compound in which a hydroxyl group is bonded to an aromatic ring, that is, a phenol, and A is preferably an anion of the phenols. Examples of the phenols include monocyclic phenols such as phenol, cresol, resorcin, and catechol, fused polycyclic phenols such as naphthol, dihydroxynaphthalene, and anthraquinol, bisphenols such as bisphenol A, bisphenol F, and bisphenol S, and polycyclic phenols such as phenylphenol and biphenol.

Examples of the phosphobetaine compound that can be used in the thermosetting resin composition of the present embodiment include a compound represented by General Formula (7).

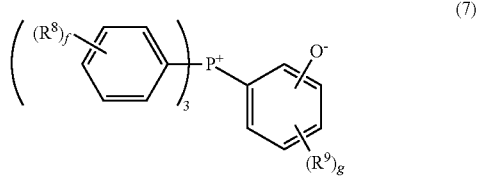
(7)

(In General Formula (7), P represents a phosphorus atom. $R^8$ represents an alkyl group having 1 to 3 carbon atoms, and $R^9$ represents a hydroxyl group. f is a number of 0 to 5, and g is a number of 0 to 3.)

The compound represented by General Formula (7) can be produced, for example, as follows. First, a step where a triaromatic-substituted phosphine which is a tertiary phosphine is brought into contact with a diazonium salt to substitute the triaromatic-substituted phosphine with a diazonium group contained in the diazonium salt is carried out to obtain the compound represented by General Formula (7). However, the method is not limited to this.

Examples of the adduct of a phosphine compound and a quinone compound, that can be used in the thermosetting resin composition of the present embodiment, include a compound represented by General Formula (8).

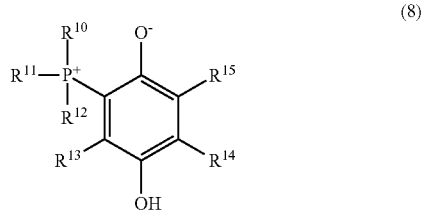
(8)

(In General Formula (8), P represents a phosphorus atom. $R^{10}$, $R^{11}$, and $R^{12}$ each represent an alkyl group having 1 to 12 carbon atoms or an aryl group having 6 to 12 carbon atoms, and they may be the same as or different from each other. $R^{13}$, $R^{14}$, and $R^{15}$ each represent a hydrogen atom or a hydrocarbon group having 1 to 12 carbon atoms, they may be the same as or different from each other, or $R^{14}$ and $R^{15}$ may be bonded to form a cyclic structure.)

As the phosphine compound used for the adduct of a phosphine compound and a quinone compound, for example, phosphines containing an aromatic ring, such as triphenylphosphine, tris(alkylphenyl)phosphine, tris (alkoxyphenyl)phosphine, trinaphthylphosphine, and tris (benzyl)phosphine, in which the aromatic ring may be unsubstituted or have a substituent such as an alkyl group and an alkoxy group are preferable. Examples of the substituent such as an alkyl group and an alkoxy group include an alkyl group and an alkoxy group, each having 1 to 6 carbon atoms. From the viewpoint of easy availability, triphenylphosphine is preferable.

Examples of the quinone compound used for the adduct of a phosphine compound and a quinone compound include benzoquinone and anthraquinones. Among these, from the viewpoint of storage stability, p-benzoquinone is preferable.

In a method of producing an adduct of a phosphine compound and a quinone compound, an organic tertiary phosphine can be brought into contact with a benzoquinone in a solvent that can dissolve both the organic tertiary phosphine and the benzoquinone and mixed to produce an adduct thereof. As the solvent, ketones such as acetone and methyl ethyl ketone may be used, with the solvent having a low solubility of the adduct therein being preferable, but the solvent is not limited to these.

The compound represented by General Formula (8), in which $R^{10}$, $R^{11}$, and $R^{12}$, all bonded to a phosphorus atom, are each preferably a phenyl group, and $R^{13}$, $R^{14}$, and $R^{15}$ are each preferably a hydrogen atom, that is, the compound produced by adding 1,4-benzoquinone to triphenylphosphine is preferable since the compound decreases the modulus of elasticity during heating of a cured product of the thermosetting resin composition.

Examples of the adduct of a phosphonium compound and a silane compound that can be used in the thermosetting resin composition of the present embodiment include a compound represented by General Formula (9).

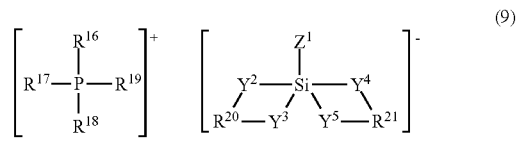
(9)

(In General Formula (9), P represents a phosphorus atom and Si represents a silicon atom. $R^{16}$, $R^{17}$, $R^{18}$, and $R^{19}$ each represent an organic group having an aromatic ring or a heterocyclic ring, or an aliphatic group, and they may be the same as or different from each other. In the formula, $R^{20}$ is an organic group which is bonded to groups $Y^2$ and $Y^3$. In the formula, $R^{21}$ is an organic group which is bonded to groups $Y^4$ and $Y^5$. $Y^2$ and $Y^3$ each represent a group formed in a case where a proton-donating substituent releases a proton, and the groups $Y^2$ and $Y^3$ in the same molecule are bonded to the silicon atom to form a chelate structure. $Y^4$ and $Y^5$ each represent a group formed in a case where a proton-donating substituent releases a proton, and the groups $Y^4$ and $Y^5$ in the same molecule are bonded to the silicon atom to form a chelate structure. $R^{20}$ and $R^{21}$ may be the same as or different from each other, and the groups $Y^2$, $Y^3$, $Y^4$, and $Y^5$ may be the same as or different from each other. $Z^1$ is an organic group having an aromatic ring or a heterocyclic ring, or an aliphatic group.)

In General Formula (9), examples of $R^{16}$, $R^{17}$, $R^{18}$, and $R^{19}$ include a phenyl group, a methylphenyl group, a methoxyphenyl group, a hydroxyphenyl group, a naphthyl group, a hydroxynaphthyl group, a benzyl group, a methyl group, an ethyl group, a n-butyl group, a n-octyl group, and a cyclohexyl group, and among these, aromatic groups having a substituent such as an alkyl group, an alkoxy group, and a hydroxyl group, and unsubstituted aromatic groups, such as a phenyl group, a methylphenyl group, a methoxyphenyl group, a hydroxyphenyl group, and a hydroxynaphthyl group, are more preferable.

Moreover, in General Formula (9), $R^{20}$ is an organic group which is bonded to $Y^2$ and $Y^3$. Similarly, $R^{21}$ is an organic group which is bonded to the groups $Y^4$ and $Y^5$. $Y^2$ and $Y^3$ are each a group formed in a case where a proton-donating substituent releases a proton, and the groups $Y^2$ and $Y^3$ in the same molecule are bonded to the silicon atom to form a chelate structure. Similarly, $Y^4$ and $Y^5$ are each a group formed in a case where a proton-donating substituent releases a proton, and the groups $Y^4$ and $Y^5$ in the same molecule are bonded to the silicon atom to forma chelate structure. The groups $R^{20}$ and $R^{21}$ may be the same as or different from each other, and the groups $Y^2$, $Y^3$, $Y^4$, and $Y^5$ may be the same as or different from each other. The groups represented by $-Y^2-R^{20}-Y^3-$ and $Y^4-R^{21}-Y^5-$ in General Formula (9) are each a group formed in a case where a proton donor releases two protons. As the proton donor, an organic acid having at least two carboxyl groups or hydroxyl groups in the molecule is preferable, an aromatic compound having at least two carboxyl groups or hydroxyl groups in the adjacent carbons constituting the aromatic ring is more preferable, and an aromatic compound having at least two hydroxyl groups in the adjacent carbons constituting the aromatic ring is still more preferable. Examples thereof include catechol, pyrogallol, 1,2-dihydroxynaphthalene, 2,3-dihydroxynaphthalene, 2,2'-biphenol, 1,1'-bi-2-naphthol, salicylic acid, 1-hydroxy-2-naphthoic acid, 3-hydroxy-2-naphthoic acid, chloranilic acid, tannic acid, 2-hydroxybenzyl alcohol, 1,2-cyclohexanediol, 1,2-propanediol, and glycerin, but among these, catechol, 1,2-dihydroxynaphthalene, and 2,3-dihydroxynaphthalene are more preferable.

Furthermore, $Z^1$ in General Formula (9) is an organic group having an aromatic ring or a heterocyclic ring, or an aliphatic group. Specific examples thereof include aliphatic hydrocarbon groups such as a methyl group, an ethyl group, a propyl group, a butyl group, a hexyl group, and an octyl group, aromatic hydrocarbon groups such as a phenyl group, a benzyl group, a naphthyl group, and a biphenyl group, and reactive substituents such as an alkyl group having a glicydyloxy group, a mercapto group, or an amino group, such as a glycidyloxypropyl group, a mercaptopropyl group, and an aminopropyl group, and a vinyl group. However, among these, a methyl group, an ethyl group, a phenyl group, a naphthyl group, and a biphenyl group are more preferable in view of thermal stability.

A method for producing an adduct of a phosphonium compound and a silane compound is as follows. A silane compound such as phenyltrimethoxysilane and a proton donor such as 2,3-dihydroxynaphthalene are added to methanol in a flask, and dissolved. Next, a sodium methoxide-methanol solution is added dropwise thereto under stirring at room temperature. A solution prepared by dissolving a tetra-substituted phosphonium halide such as tetraphenyl phosphonium bromide in methanol in advance is added to the resulting reaction product dropwise under stirring at room temperature to precipitate crystals. The precipitated crystals are filtered, washed with water, and dried in vacuum to obtain an adduct of the phosphonium compound and the silane compound. However, the method is not limited to this.

In the present embodiment, the content of the curing accelerator is preferably equal to or more than 0.1% by mass, more preferably equal to or more than 0.15% by mass, and particularly preferably equal to or more than 0.25% by mass, with respect to the total amount of the thermosetting resin composition. By setting the content of the curing accelerator to be equal to or more than the lower limit value, it is possible to improve the curability during molding effectively.

On the other hand, the content of the curing accelerator is preferably equal to or less than 1% by mass, and more preferably equal to or less than 0.8% by mass, with respect to the total amount of the thermosetting resin composition. By setting the content of the curing accelerator to equal to or less than the upper limit value, it is possible to promote the fluidity during molding.

Furthermore, the thermosetting resin composition of the present embodiment can contain a coupling agent.

The coupling agent can include one or more selected from the group consisting of mercaptosilane, aminosilane, and epoxysilane.

Examples of the epoxysilanes include γ-glycidoxypropyltriethoxysilane, γ-glycidoxypropyltrimethoxysilane, γ-glycidoxypropylmethyldimethoxysilane, and β-(3,4-epoxycyclohexyl)ethyltrimethoxysilane.

In addition, examples of the aminosilane include phenylaminopropyltrimethoxysilane, γ-aminopropyltriethoxysilane, γ-aminopropyltrimethoxysilane, N-β-(aminoethyl)-γ-aminopropyltrimethoxysilane, N-β-(aminoethyl)-γ-aminopropylmethyldimethoxysilane, N-phenyl-γ-aminopropyltriethoxysilane, N-phenyl-γ-aminopropyltrimethoxysilane, N-β-(aminoethyl)-γ-aminopropyltriethoxysilane, N-6-(aminohexyl)-3-aminopropyltrimethoxysilane, and N-(3-(trimethoxysilylpropyl)-1,3-benzenedimethanane. A latent aminosilane coupling agent protected by reacting a primary amino moiety of aminosilane with ketone or aldehyde may be used. In addition, a secondary amino group may be contained in the aminosilane.

In addition, examples of the mercaptosilane include a silane coupling agent exhibiting the same function as the mercaptosilane coupling agent by thermal decomposition, such as bis(3-triethoxysilylpropyl)tetrasulfide and bis(3-triethoxysilylpropyl)disulfide, in addition to γ-mercaptopropyltrimethoxysilane and 3-mercaptopropylmethyldimethoxysilane.

In addition, these silane coupling agents may also be added after hydrolyzing in advance. These silane coupling agents may be used singly or in a combination of two or more kinds thereof.

In the present embodiment, by incorporating one or more selected from the group consisting of mercaptosilane, aminosilane, and epoxysilane as the coupling agent, the viscosity of the thermosetting resin composition can be optimized, and thus, mold formality can be improved.

From the viewpoint of mold formality, mercaptosilane is preferable, from the viewpoint of fluidity, secondary aminosilane is preferable, and from the viewpoint of adhesiveness, epoxysilane is preferable.

A lower limit value of the content of the coupling agent is preferably equal to or more than 0.01% by mass, more preferably equal to or more than 0.05% by mass, and particularly preferably equal to or more than 0.1% by mass, with respect to the total amount of the thermosetting resin composition. With these values, it is possible to increase the flow length of the thermosetting resin composition, and thus, improve the injection moldability. On the other hand, an upper limit value of the content of the coupling agent is preferably equal to or less than 1% by mass, more preferably equal to or less than 0.8% by mass, and particularly preferably equal to or less than 0.6% by mass, with respect to the total amount of the thermosetting resin composition. With these values, it is possible to obtain good anti-rust properties while not increasing the water-absorbing property of a cured product of the thermosetting resin composition.

(Other Components)

The thermosetting resin composition of the present embodiment may contain additives, for example, such as a release agent, a flame retardant, an ion trapping agent, a coloring agent, a low-stress agent, and an antioxidant, as desired. These may be used singly or in combination of two or more kinds thereof.

Examples of the release agent include one or two or more selected from natural wax such as carnauba wax, synthetic wax such as montanic acid ester wax and polyethylene oxide wax, a higher fatty acid or a metal salt thereof such as zinc stearate, and paraffin.

Examples of the flame retardant include one or two or more selected from aluminum hydroxide, magnesium hydroxide, zinc borate, zinc molybdate, and a phosphazene.

Examples of the ion trapping agent include one or two or more selected from hydrotalcites or hydrated oxides of elements selected from magnesium, aluminum, bismuth, titanium, and zirconium.

Examples of the coloring agent include one or two or more selected from carbon black, red iron oxide, and titanium oxide.

Examples of the low-stress agent include one or two or more selected from a silicone compound, an acrylonitrilebutadiene copolymerized compound, silicone oil, and silicone rubber.

Furthermore, the thermosetting resin composition of the present embodiment may be configured not to contain carbon such as carbon black used as the coloring agent. With such a configuration, plating deposit characteristics can be improved.

Next, the characteristics of the thermosetting resin composition of the present embodiment will be described.

A lower limit value of the spiral flow length of the thermosetting resin composition of the present embodiment is, for example, equal to or more than 50 cm, preferably equal to or more than 55 cm, and more preferably equal to or more than 60 cm. With these values, it is possible to make the fluidity of the thermosetting resin composition excellent, and thus, improve the moldability. The upper limit value of the spiral flow length is not particularly limited, but may be, for example, equal to or less than 200 cm.

In the present embodiment, the spiral flow length can be measured under the conditions of a mold temperature of 175° C., an injection pressure of 6.9 MPa, and a dwelling time of 120 seconds in accordance with an EMMI-1-66 method.

In a method for producing the thermosetting resin composition of the present embodiment, for example, the respective components of the thermosetting resin composition are mixed by a known unit to obtain a mixture. Further, the mixture is melt-kneaded to obtain a kneaded product. As the kneading method, for example, an extruder such as a monoaxial kneading extruder and a biaxial kneading extruder, or a roll-type kneader such as a mixing roll can be used, but the biaxial kneading extruder is preferably used. After cooling, the kneaded product can be formed into a predetermined shape.

The shape of the thermosetting resin composition of the present embodiment may be a predetermined shape such as, for example, a powdery, granular, tablet, or sheet shape. In this manner, a thermosetting resin composition suitable for a known molding method such as transfer molding, injection molding, and compression molding can be obtained.

In the present embodiment, the thermosetting resin composition in a powdery shape means a pulverized product obtained by pulverizing the obtained kneaded product, the thermosetting resin composition in a granular shape means an aggregate obtained by solidifying powders (kneaded powdery products) of the thermosetting resin composition or a granule obtained by a known granulation method, the thermosetting resin composition in a tablet shape means a shaped product formed into a predetermined shape by tablet-molding the thermosetting resin composition at a high pressure, the thermosetting resin composition in a sheet shape means a resin film formed of a thermosetting resin composition in a sheet-like shape or rollable roll shape.

In the present embodiment, the thermosetting resin composition in the powdery, granular, tablet, or sheet shape may be in a semi-cured state (stage B state).

Examples of the method for molding the thermosetting resin composition in the present embodiment include mold forming such as injection molding and transfer molding. By using such a molding method, it is possible to produce a resin molded article including a cured product of the thermosetting resin composition.

The resin molded article in the present embodiment is not particularly limited in its shape as long as it has a three-dimensional structure, and the resin molded article may have a curved surface in components.

The three-dimensional molded interconnect device (hereinafter called "MID") is one having a three elements of a three-dimensional shape, the resin molded article, a three-dimensional circuit, and is, for example, a part formed into a circuit with a metal film on a surface of the resin molded article of the three-dimensional structure. Specifically, the three-dimensional molded interconnect device can include, for example, a resin molded article having a three-dimensional structure, and a three-dimensional circuit formed on the surface of the resin molded article. By using such a three-dimensional molded interconnect device (MID), the space can be effectively utilized, and it is thus possible to reduce the number of components or miniaturize the components.

LDS of the present embodiment is one of methods for producing MID, in which a metal nucleus is produced on the surface of a cured product (resin molded article with a three-dimensional structure) of the thermosetting resin composition containing a LDS additive with active energy rays, and the metal nucleus as a seed can be subjected to an electroless plating treatment or the like, thereby forming a plated pattern (wiring) in a region irradiated with energy rays.

In the present embodiment, a step for producing the MID can include manufacturing a thermosetting resin composition for use in LDS, molding the thermosetting resin composition, irradiating the obtained resin molded article with active energy rays, and forming a circuit by a plating treatment. In addition, a surface washing step can be added before the plating treatment.

In the present embodiment, for example, laser can be used as the active energy rays. The laser can be appropriately selected from known laser, for example, such as YAG laser, excimer laser, and electron beams, and the YGA laser is preferable. Further, the wavelength of the laser is also not particularly determined, but is, for example, 200 nm to 12,000 nm. Among these, preferably, 248 nm, 308 nm, 355 nm, 532 nm, 1064 nm, or 10,600 nm may be used.

As the plating treatment, any one of electric plating or electroless plating may be used. By subjecting the above-mentioned region irradiated with laser to a plating treatment, a circuit (plated layer) can be formed. The plating liquid is not particularly determined, and a wide range of known plating liquids can be employed, and as the metal component, a plating liquid in which copper, nickel, gold, silver, and palladium are mixed may be used.

In the present embodiment, the resin molded article (cured product of the thermosetting resin composition) is not limited to a final product, but can also encompass composite materials or various components. The resin molded article can be used as a portable electronic device, components of vehicles or medical equipment, other electronic components including electrical circuits, semiconductor encapsulation materials, or composite materials for forming these. In addition, the MID can also be applied to a mobile phone or smartphone, visceral antenna, a sensor, or a semiconductor device.

The embodiments of the invention have been described above but are only exemplary of the invention. Thus, other various configurations may also be employed.

EXAMPLES

Hereinafter, the invention will be specifically described with reference to Examples, but the invention is limited to these Examples by no means.

The components used in each of Examples and each of Reference Examples will be shown below.

(Preparation of Thermosetting Resin Composition)

The respective raw materials in the blending amounts shown in Tables 1 to 3 below were mixed at normal temperature using a mixer, and then roll-kneaded at 70° C. to 100° C. Subsequently, the obtained kneaded product was cooled, followed by pulverization, to obtain a thermosetting resin composition in a powdery shape. Then, the composition was tablet-molded at a high pressure to obtain a thermosetting resin composition in a tablet shape.

(Thermosetting Resin)

Thermosetting resin 1: Phenolaralkyl resin-type epoxy resin having a biphenylene skeleton (NC3000 manufactured by Nippon Kayaku Co., Ltd., epoxy equivalent: 276 g/eq, softening point: 58° C.)

Thermosetting resin 2: Orthocresol novolac-type epoxy resin ("EOCN1020" manufactured by Nippon Kayaku Co., Ltd., softening point: 55° C., epoxy equivalent: 196, amount of chlorine ions: 5.0 ppm)

Thermosetting resin 3: Triphenylmethane-type epoxy resin (1032H-60 manufactured by Mitsui Chemicals, Inc., epoxy equivalent: 171 g/eq, softening point: 60° C.)

Thermosetting resin 4: biphenyl-type epoxy resin (YX4000HK manufactured by Japan Epoxy Resins Co., Ltd., softening point: 105° C., epoxy equivalent: 193)

(Curing Agent)

Curing agent 1: Phenolaralkyl resin having a biphenylene skeleton (MEH-7851SS manufactured by Meiwa Plastic Industries, Ltd., hydroxyl group equivalent: 203 g/eq)

Curing agent 2: Phenol novolac resin (PR-HF-3 (phenol novolac resin, hydroxyl group equivalent: 105 g/eq, softening point: 80° C.) manufactured by Sumitomo Bakelite Co., Ltd.)

Curing agent 3: Formaldehyde-modified triphenylmethane-type phenol resin (HE910-20 manufactured by Air Water Inc.)

(Inorganic Filler)

Inorganic filler 1: Molten spherical silica (average particle diameter D50: 3.4 µm, D90: 6.8 µm, D90/D50: 2.0, particles with a size of more than 12 µm: equal to or less than 0.5% by mass, MUF-4V manufactured by Tatsumori Ltd.)

Inorganic filler 2: Molten spherical silica (average particle diameter D50: 0.9 µm, D90: 1.6 µm, D90/D50: 1.8, SD2500-SQ manufactured by Admatechs Co., Ltd.)

Inorganic filler 3: Molten spherical silica (average particle diameter D50: 6.2 µm, D90: 20.4 µm, D90/D50: 3.3, particles with a size of more than 24 µm: equal to or less than 0.5% by mass, FEB24S5 manufactured by Admatechs Co., Ltd.)

Inorganic filler 4: Molten spherical silica (average particle diameter D50: 12.3 µm, D90: 36.8 µm, D90/D50: 3.0, particles with a size of more than 45 µm: equal to or less than 0.5% by mass, FED45S2 manufactured by Admatechs Co., Ltd.)

Inorganic filler 5: Molten spherical silica (average particle diameter D50: 7.2 µm, D90: 43.9 µm, D90/D50: 6.1, FB-105FD manufactured by Denki Chemical Co., Ltd.)

Inorganic filler 6: Molten spherical silica (average particle diameter D50: 0.8 µm, D90: 1.3 µm, D90/D50: 1.7, SC2500SQ manufactured by Admatechs Co., Ltd.)

Inorganic filler 7: Molten spherical silica (average particle diameter D50: 1.0 µm, D90: 4.0 µm, D90/D50: 3.8, SC5500SQ manufactured by Admatechs Co., Ltd.)

(Non-Conductive Metal Compound)

Non-conductive metal compound 1: Black 30C965: $CuCr_2O_4$ (manufactured by Shepherd Color Company)

Non-conductive metal compound 2: Black 1G: $CuCr_2O_4$ (manufactured by Shepherd Color Company)

(Curing Accelerator)

Curing accelerator 1: Tetraphenylphosphonium bis(naphthalene-2,3-dioxy)phenylsilicate represented by Structural Formula (16), obtained by the following production method

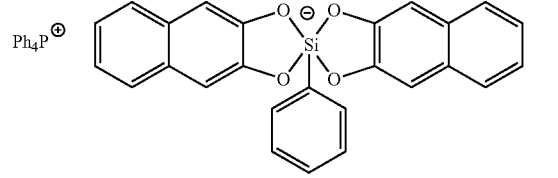

(16)

[Method for Synthesizing Curing Accelerator 1]

249.5 g of phenyltrimethoxysilane and 384.0 g of 2,3-dihydroxynaphthalene were added to a flask charged with 1,800 g of methanol, and then 231.5 g of a 28% solution of sodium methoxide in methanol was added dropwise thereto under stirring at room temperature. Then, a solution obtained by dissolving 503.0 g of tetraphenylphosphonium bromide in 600 g of methanol, prepared in advance, was added to the mixture under stirring at room temperature to precipitate crystals. The precipitated crystals were filtered, washed with water, and dried under vacuum to obtain a curing accelerator 1 as pink-white crystals.

Curing Accelerator 2:
Tetraphenylphosphonium.4,4'-sulfonyldiphenolate represented by Structural Formula (14), obtained by the following production method

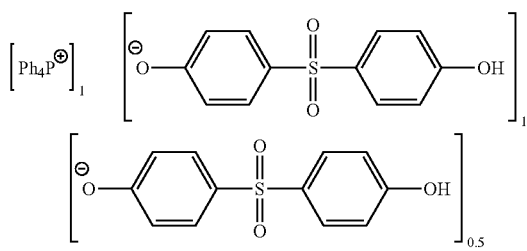

(14)

[Method for Synthesizing Curing Accelerator 2]
37.5 g (0.15 mol) of 4,4'-bisphenol S and 100 ml of methanol were introduced into a separable flask equipped with a stirring device and dissolved under stirring at room temperature. A solution obtained by dissolving 4.0 g (0.1 mol) of sodium hydroxide in 50 ml of methanol in advance was further added thereto under stirring. Subsequently, a solution obtained by dissolving 41.9 g (0.1 mol) of tetraphenyl phosphonium bromide in 150 ml of methanol in advance was added to the mixture. Stirring was continued for a while, 300 ml of methanol was added thereto, and then the solution in the flask was added dropwise to a large amount of water under stirring to obtain white precipitates. The precipitates were filtered and dried to obtain a curing accelerator 2 as white crystals.

(Coupling Agents)
Coupling agent 1: Phenylaminopropyltrimethoxysilane (CF4083 manufactured by Dow Corning Toray Co., Ltd.)
Coupling agent 2: γ-Glicydoxypropyltrimethoxysilane (GPS-M manufactured by Chisso Corporation)
Coupling agent 3: γ-Mercaptopropyltrimethoxysilane (S810 manufactured by Chisso Corporation)

(Additives)
Carbon 1: Carbon black (Carbon #5 manufactured by Mitsubishi Chemical Corporation)
Release agent 1: Glycerin trimontanic acid ester (Licolub WE4 manufactured by Clariant Japan Co., Ltd.)
Silicone oil 1: Silicone oil (FZ-3730 manufactured by Dow Corning Toray Co., Ltd.
Low-stress agent 1: Epoxidized polybutadiene (JP-200 manufactured by Nippon Soda Co., Ltd., Td5: 245° C.)
Flame retardant 1: Aluminum hydroxide (trade name CL303 manufactured by Sumitomo Chemical Co., Ltd.)

TABLE 1

|  |  |  | Unit | Reference Example 1 | Example 1 | Example 2 | Example 3 | Example 4 |
|---|---|---|---|---|---|---|---|---|
| Thermosetting resin composition | Inorganic filler | Inorganic filler 1 | % by mass | 70.00 |  |  | 75.00 |  |
|  |  | Inorganic filler 2 |  | 10.00 | 10.00 | 10.00 | 10.00 | 10.00 |
|  |  | Inorganic filler 3 |  |  | 70.00 |  |  | 75.00 |
|  |  | Inorganic filler 4 |  |  |  | 70.00 |  |  |
|  | Additive | Carbon 1 |  | 0.30 | 0.30 | 0.30 | 0.30 | 0.30 |
|  | Coupling agent | Coupling agent 1 |  | 0.20 | 0.20 | 0.20 | 0.20 | 0.20 |
|  | Thermosetting resin | Thermosetting resin 1 |  | 11.27 |  | 2.86 | 3.50 | 2.51 |
|  |  | Thermosetting resin 2 |  |  | 10.79 |  |  |  |
|  |  | Thermosetting resin 3 |  |  |  | 2.86 | 3.50 |  |
|  | Curing agent | Curing agent 1 |  | 6.93 |  | 1.49 | 1.91 | 1.31 |
|  |  | Curing agent 2 |  |  | 4.91 |  |  |  |
|  |  | Curing agent 3 |  |  |  | 1.49 | 1.91 |  |
|  | Curing accelerator | Curing accelerator 1 |  | 0.40 | 0.40 | 0.40 | 0.30 | 0.30 |
|  |  | Curing accelerator 2 |  | 0.05 | 0.05 | 0.05 | 0.03 | 0.03 |
|  | Additive | Release agent 1 |  | 0.20 | 0.20 | 0.20 | 0.20 | 0.20 |
|  | Additive | Silicone oil 1 |  | 0.15 | 0.15 | 0.15 | 0.15 | 0.15 |
|  | Non-conductive metal compound | Non-conductive metal compound 1 |  | 0.50 | 3.00 | 10.00 | 3.00 | 10.00 |
|  | Total |  |  | 100 | 100 | 100 | 100 | 100 |
|  | Plating properties |  |  | C | B | A | B | A |

|  |  |  | Unit | Reference Example 2 | Example 5 | Reference Example 3 | Example 6 |
|---|---|---|---|---|---|---|---|
| Thermosetting resin composition | Inorganic filler | Inorganic filler 1 | % by mass |  | 65.00 |  |  |
|  |  | Inorganic filler 2 |  | 10.00 | 10.00 | 10.00 | 10.00 |
|  |  | Inorganic filler 3 |  |  |  | 65.00 |  |
|  |  | Inorganic filler 4 |  | 75.00 |  |  | 65.00 |
|  | Additive | Carbon 1 |  | 0.30 | 0.30 | 0.30 | 0.30 |
|  | Coupling agent | Coupling agent 1 |  | 0.20 | 0.20 | 0.20 | 0.20 |
|  | Thermosetting resin | Thermosetting resin 1 |  |  |  | 7.44 | 12.78 |
|  |  | Thermosetting resin 2 |  | 9.14 | 9.40 |  |  |
|  |  | Thermosetting resin 3 |  |  |  | 7.44 |  |
|  | Curing agent | Curing agent 1 |  |  |  | 4.10 | 7.80 |
|  |  | Curing agent 2 |  | 4.18 | 4.18 |  |  |
|  |  | Curing agent 3 |  |  |  | 4.10 |  |

TABLE 1-continued

| | | | | | | |
|---|---|---|---|---|---|---|
| Curing accelerator | Curing accelerator 1 | | 0.30 | 0.50 | 0.50 | 0.50 |
| | Curing accelerator 2 | | 0.03 | 0.07 | 0.07 | 0.07 |
| Additive | Release agent 1 | | 0.20 | 0.20 | 0.20 | 0.20 |
| Additive | Silicone oil 1 | | 0.15 | 0.15 | 0.15 | 0.15 |
| Non-conductive metal compound | Non-conductive metal compound 1 | | 0.50 | 10.00 | 0.50 | 3.00 |
| | Total | | 100 | 100 | 100 | 100 |
| | Plating properties | | C | A | C | B |

TABLE 2

| | | | Unit | Example 7 | Example 8 | Example 9 | Example 10 |
|---|---|---|---|---|---|---|---|
| Thermosetting resin composition | Inorganic filler | Inorganic filler 1 | % by mass | 65.00 | 65.00 | 65.00 | 65.00 |
| | | Inorganic filler 2 | | 10.00 | 10.00 | 10.00 | 10.00 |
| | Additive | Carbon 1 | | 0.30 | 0.30 | 0.30 | 0.30 |
| | Coupling agent | Coupling agent 1 | | 0.20 | 0.20 | | |
| | | Coupling agent 2 | | | | 0.20 | 0.20 |
| | | Coupling agent 3 | | | | | |
| | Thermosetting resin | Thermosetting resin 2 | | 9.40 | | | 9.30 |
| | | Thermosetting resin 1 | | | 4.34 | 4.48 | |
| | | Thermosetting resin 3 | | | 4.34 | 4.47 | |
| | Curing agent | Curing agent 2 | | 4.18 | | | 4.13 |
| | | Curing agent 1 | | | 2.30 | 2.39 | |
| | | Curing agent 3 | | | 2.30 | 2.39 | |
| | Curing accelerator | Curing accelerator 1 | | 0.50 | 0.50 | 0.50 | 0.50 |
| | | Curing accelerator 2 | | 0.07 | 0.07 | 0.07 | 0.07 |
| | Additive | Release agent 1 | | 0.20 | | 0.20 | |
| | Non-conductive metal compound | Non-conductive metal compound 2 | | 10.00 | | | 10.00 |
| | | Non-conductive metal compound 1 | | | 10.00 | 10.00 | |
| | Additive | Silicone oil 1 | | 0.15 | 0.15 | | |
| | | Low-stress agent 1 | | | 0.50 | | 0.50 |
| | | Total | | 100 | 100 | 100 | 100 |
| | | Plating properties | | A | A | A | A |

| | | | Unit | Example 11 | Example 12 | Example 13 | Example 14 |
|---|---|---|---|---|---|---|---|
| Thermosetting resin composition | Inorganic filler | Inorganic filler 1 | % by mass | 65.00 | 65.00 | 65.00 | 65.00 |
| | | Inorganic filler 2 | | 10.00 | 10.00 | 10.00 | 10.00 |
| | Additive | Carbon 1 | | 0.30 | 0.30 | 0.30 | 0.30 |
| | Coupling agent | Coupling agent 1 | | | | 0.20 | 0.20 |
| | | Coupling agent 2 | | 0.20 | 0.20 | | |
| | | Coupling agent 3 | | 0.10 | 0.10 | 0.10 | 0.10 |
| | Thermosetting resin | Thermosetting resin 2 | | 8.99 | | | 9.57 |
| | | Thermosetting resin 1 | | | 4.46 | 4.29 | |
| | | Thermosetting resin 3 | | | 4.46 | 4.28 | |
| | Curing agent | Curing agent 2 | | 3.99 | | | 4.26 |
| | | Curing agent 1 | | | 2.38 | 2.28 | |
| | | Curing agent 3 | | | 2.38 | 2.28 | |
| | Curing accelerator | Curing accelerator 1 | | 0.50 | 0.50 | 0.50 | 0.50 |
| | | Curing accelerator 2 | | 0.07 | 0.07 | 0.07 | 0.07 |
| | Additive | Release agent 1 | | 0.20 | | 0.20 | |
| | Non-conductive metal compound | Non-conductive metal compound 2 | | | 10.00 | 10.00 | |
| | | Non-conductive metal compound 1 | | 10.00 | | | 10.00 |
| | Additive | Silicone oil 1 | | 0.15 | 0.15 | | |
| | | Low-stress agent 1 | | 0.50 | | 0.50 | |
| | | Total | | 100 | 100 | 100 | 100 |
| | | Plating properties | | A | A | A | A |

TABLE 3

| | | | Unit | Example 15 | Example 16 | Example 17 | Example 18 |
|---|---|---|---|---|---|---|---|
| Thermosetting resin composition | Inorganic filler | Inorganic filler 5 | % by mass | 69.00 | 69.00 | 69.00 | 69.00 |
| | | Inorganic filler 6 | | 5.00 | 5.00 | 5.00 | 5.00 |
| | | Inorganic filler 7 | | 5.00 | 5.00 | 5.00 | 5.00 |
| | Thermosetting resin | Thermosetting resin 1 | | | | | |
| | | Thermosetting resin 2 | | | | 1.03 | 2.60 |
| | | Thermosetting resin 4 | | 5.18 | 5.14 | 4.13 | 2.59 |
| | Curing agent | Curing agent 1 | | 2.28 | 2.18 | 2.17 | 2.15 |
| | | Curing agent 2 | | 1.14 | 1.18 | 1.17 | 1.16 |
| | Curing accelerator | Curing accelerator 1 | | 0.40 | 0.40 | 0.40 | 0.40 |
| | | Curing accelerator 2 | | 0.05 | 0.05 | 0.05 | 0.05 |
| | Coupling agent | Coupling agent 1 | | | 0.10 | 0.10 | 0.10 |
| | | Coupling agent 2 | | 0.20 | 0.20 | 0.20 | 0.20 |
| | | Coupling agent 3 | | 0.10 | 0.10 | 0.10 | 0.10 |
| | Additive | Release agent 1 | | 0.20 | 0.20 | 0.20 | 0.20 |
| | | Silicone oil 1 | | 0.15 | 0.15 | 0.15 | 0.15 |
| | | Carbon 1 | | 0.30 | 0.30 | 0.30 | 0.30 |
| | | Flame retardant 1 | | 1.00 | 1.00 | 1.00 | 1.00 |
| | Non-conductive metal compound | Non-conductive metal compound 1 | | 10.00 | 10.00 | 10.00 | 10.00 |
| | | Total | | 100 | 100 | 100 | 100 |
| | | Spiral flow | cm | 65 | 90 | 82 | 65 |
| | | Plating properties | | A | A | A | A |

| | | | Unit | Example 19 | Example 20 | Example 21 |
|---|---|---|---|---|---|---|
| Thermosetting resin composition | Inorganic filler | Inorganic filler 5 | % by mass | 69.00 | 69.00 | 69.00 |
| | | Inorganic filler 6 | | 5.00 | 5.00 | 5.00 |
| | | Inorganic filler 7 | | 5.00 | 5.00 | 5.00 |
| | Thermosetting resin | Thermosetting resin 1 | | 1.06 | 2.75 | |
| | | Thermosetting resin 2 | | | | |
| | | Thermosetting resin 4 | | 4.22 | 2.75 | 5.32 |
| | Curing agent | Curing agent 1 | | 2.09 | 1.95 | 2.26 |
| | | Curing agent 2 | | 1.13 | 1.05 | 1.22 |
| | Curing accelerator | Curing accelerator 1 | | 0.40 | 0.40 | 0.40 |
| | | Curing accelerator 2 | | 0.05 | 0.05 | 0.05 |
| | Coupling agent | Coupling agent 1 | | 0.10 | 0.10 | 0.10 |
| | | Coupling agent 2 | | 0.20 | 0.20 | 0.20 |
| | | Coupling agent 3 | | 0.10 | 0.10 | 0.10 |
| | Additive | Release agent 1 | | 0.20 | 0.20 | 0.20 |
| | | Silicone oil 1 | | 0.15 | 0.15 | 0.15 |
| | | Carbon 1 | | 0.30 | 0.30 | |
| | | Flame retardant 1 | | 1.00 | 1.00 | 1.00 |
| | Non-conductive metal compound | Non-conductive metal compound 1 | | 10.00 | 10.00 | 10.00 |
| | | Total | | 100 | 100 | 100 |
| | | Spiral flow | cm | 77 | 54 | 107 |
| | | Plating properties | | A | A | A |

Comparative Examples 1 and 2

The thermosetting resin composition of Comparative Example 1 was prepared in the same manner as in Example 1 except that a coupling agent was not added. The thermosetting resin composition of Comparative Example 2 was prepared in the same manner as in Example 1 except that a non-conductive metal compound was not added.

The thermosetting resin compositions of Examples 1 to 21, Reference Examples 1 to 3, and Comparative Examples 1 and 2 were subjected to transfer molding to obtain each of resin molded articles. Surfaces of the resin molded articles obtained in Examples 1 to 21 were irradiated with YAG laser, and thus, it could be seen that the plating deposit characteristics in the regions irradiated with laser were better, as compared with each of Comparative Examples 1 and 2.

Furthermore, the thermosetting resin composition of each of Examples and each of Reference Examples was evaluated as follows.

(Spiral Flow)

The spiral flow length was measured under the conditions of a mold temperature of 175° C., an injection pressure of 6.9 MPa, and a dwelling time of 120 seconds, using the obtained thermosetting resin composition, in accordance with an EMMI-1-66 method.

(Plating Properties)

Surfaces of the obtained resin molded articles were irradiated with YAG laser, and the plating properties in the regions irradiated with laser were evaluated in accordance with the following evaluation standards.

A: The plating surfaces do not have unevenness.

B: More or less unevenness is observed on the plating surfaces, but there is no area having plating missing.

C: Unevenness is observed on the plating surfaces, but there is no area having plating missing.

D: Severe unevenness is observed on the plating surfaces, but there is an area having plating missing.

This application claims priority based on Japanese Patent Application No. 2016-099412, filed on May 18, 2016, the entire disclosure of which is hereby incorporated by reference.

The invention claimed is:

1. A thermosetting resin composition for laser direct structuring (LDS), used for LDS, comprising:
    a thermosetting resin;
    an inorganic filler;
    a non-conductive metal compound that forms a metal nucleus upon irradiation with active energy rays; and
    a coupling agent,
    wherein said thermosetting resin composition does not include a thermoplastic resin,
    wherein the non-conductive metal compound includes one or more selected from the group consisting of
        a spinel metal oxide,
        a metal oxide having two or more transition metal elements in groups adjacent to each other, the groups being selected from groups 3 to 12 of the periodic table, and
        a tin-containing oxide, and
    wherein the inorganic filler, which is different from the non-conductive metal compound, includes one or two or more selected from the group consisting of silica, alumina, aluminum hydroxide, silicon nitride, and aluminum nitride,
    wherein the coupling agent includes one or more selected from the group consisting of mercaptosilane, aminosilane, and epoxysilane,
    wherein the thermosetting resin composition is a melt-kneaded product, and
    wherein the thermosetting resin composition is in a stage B state, and is powdery, granular, or in the shape of a tablet.

2. The thermosetting resin composition for LDS according to claim 1,
    wherein an average particle diameter D50 of the inorganic filler is equal to or less than 30 μm.

3. The thermosetting resin composition for LDS according to claim 1,
    wherein a D90 of the inorganic filler is equal to or less than 80 μm.

4. The thermosetting resin composition for LDS according to claim 1,
    wherein a particle size distribution width (D90/D50) of the inorganic filler is equal to or less than 10.

5. The thermosetting resin composition for LDS according to claim 1,
    wherein a content of the non-conductive metal compound is equal to or more than 5% by mass and equal to or less than 18% by mass with respect to the total amount of the thermosetting resin composition for LDS.

6. The thermosetting resin composition for LDS according to claim 1,
    wherein a spiral flow length of the thermosetting resin composition for LDS, as measured under the conditions of a mold temperature of 175° C., an injection pressure of 6.9 MPa, and a dwelling time of 120 seconds in accordance with an EMMI-1-66 method, is equal to or more than 50 cm.

7. The thermosetting resin composition for LDS according to claim 1,
    wherein carbon is not included.

8. The thermosetting resin composition for LDS according to claim 1,
    wherein the non-conductive metal compound contains the spinel metal oxide containing copper or chromium.

9. The thermosetting resin composition for LDS according to claim 1,
    wherein the inorganic filler includes silica.

10. The thermosetting resin composition for LDS according to claim 1,
    wherein the thermosetting resin includes an epoxy resin.

11. The thermosetting resin composition for LDS according to claim 10,
    wherein the epoxy resin includes one or more selected from the group consisting of an orthocresol novolac epoxy resin, a phenolaralkyl epoxy resin having a biphenylene skeleton, and a triphenylmethane epoxy resin.

12. The thermosetting resin composition for LDS according to claim 1, further comprising a curing agent.

13. The thermosetting resin composition for LDS according to claim 1, further comprising a curing accelerator.

14. The thermosetting resin composition for LDS according to claim 1,
    wherein the content of the thermosetting resin is equal to or more than 1% by mass and equal to or less than 15% by mass with respect to the total amount of the thermosetting resin composition.

15. The thermosetting resin composition for LDS according to claim 1,
    wherein the content of the coupling agent is equal to or more than 0.01% by mass and equal to or less than 1% by mass with respect to the total amount of the thermosetting resin composition.

16. The thermosetting resin composition for LDS according to claim 1,
    where in the silica selected from the group consisting of molten crushed silica, molten spherical silica, and crystalline silica.

17. The thermosetting resin composition for LDS according to claim 1, further comprising one or two or more selected from a release agent, a flame retardant, an ion trapping agent, a coloring agent, a low-stress agent, and an antioxidant.

18. The thermosetting resin composition for LDS according to claim 17,
    wherein the release agent includes one or two or more selected from natural wax, carnauba wax, synthetic wax, montanic acid ester wax, polyethylene oxide wax, a higher fatty acid or a metal salt thereof, zinc stearate, and paraffin,
    wherein the flame retardant includes one or two or more selected from aluminum hydroxide, magnesium hydroxide, zinc borate, zinc molybdate, and a phosphazene,
    wherein the ion trapping agent includes one or two or more selected from hydrotalcites or hydrated oxides of elements selected from magnesium, aluminum, bismuth, titanium, and zirconium,
    wherein the coloring agent includes one or two or more selected from carbon black, red iron oxide, and titanium oxide, and
    wherein the low-stress agent includes one or two or more selected from a silicone compound, an acrylonitrilebutadiene copolymerized compound, silicone oil, and silicone rubber.

* * * * *